United States Patent
Umeda et al.

(10) Patent No.: US 9,515,606 B2
(45) Date of Patent: Dec. 6, 2016

(54) OSCILLATOR AND RADIO COMMUNICATION DEVICE

(75) Inventors: Toshiyuki Umeda, Tokyo (JP); Shoji Otaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 425 days.

(21) Appl. No.: 13/526,005

(22) Filed: Jun. 18, 2012

(65) Prior Publication Data

US 2013/0059548 A1 Mar. 7, 2013

(30) Foreign Application Priority Data

Sep. 6, 2011 (JP) .................. 2011-194283

(51) Int. Cl.
| | |
|---|---|
| H04B 1/38 | (2015.01) |
| H03L 1/00 | (2006.01) |
| H03B 5/12 | (2006.01) |
| H03D 11/02 | (2006.01) |

(52) U.S. Cl.
CPC .......... *H03B 5/1215* (2013.01); *H03B 5/1228* (2013.01); *H03B 5/1243* (2013.01); *H03D 11/02* (2013.01)

(58) Field of Classification Search
CPC .............. H03L 1/00; H03L 7/099; H04B 1/38; H04B 1/06; H02J 13/00; H04Q 5/22; G08C 19/16; G06F 1/32; G06F 1/28; G06F 1/26; H02M 3/335; G05F 1/10
USPC .................................. 455/318–322
See application file for complete search history.

(56) References Cited

U.S. PATENT DOCUMENTS

| 7,826,815 B2* | 11/2010 | Ajram ................... H02M 3/156 348/571 |
| 8,270,535 B2* | 9/2012 | Iizuka ..................... H03D 7/18 375/316 |
| 2003/0098733 A1* | 5/2003 | Saita ......................... G06F 1/04 327/291 |
| 2004/0157576 A1* | 8/2004 | Adachi ............... H03F 3/45183 455/260 |
| 2004/0198288 A1* | 10/2004 | Sadowski .............. H03D 11/02 455/259 |

(Continued)

FOREIGN PATENT DOCUMENTS

| GB | 2 433 365 A | 6/2007 |
| JP | 10-256928 A | 9/1998 |

OTHER PUBLICATIONS

Japanese Office Action dated Dec. 20, 2013 (and English translation thereof) in counterpart Japanese Application No. 2011-194283.

(Continued)

*Primary Examiner* — Edward Urban
*Assistant Examiner* — Ralph H Justus
(74) *Attorney, Agent, or Firm* — Holtz, Holtz & Volek PC (57) ABSTRACT

According to an embodiment, there is provided with an oscillator including: a clock circuit, a power supply current source and an oscillating circuit wherein the clock circuit generates a clock signal, the power supply current source generates a power supply current according to the clock signal, and the oscillating circuit generates an oscillation signal of a higher frequency than a frequency of the clock signal based on the power supply current and a received signal from an input terminal, the received signal having amplitude of a predetermined level or more.

20 Claims, 8 Drawing Sheets

(56) References Cited

U.S. PATENT DOCUMENTS

| | | | |
|---|---|---|---|
| 2006/0114067 A1* | 6/2006 | Kaneko | H03L 7/0891 331/12 |
| 2007/0139130 A1* | 6/2007 | Kim | H03D 11/06 331/185 |
| 2009/0128118 A1* | 5/2009 | Ito | H02M 3/157 323/318 |
| 2011/0228568 A1* | 9/2011 | Balakrishnan | H02M 3/157 363/21.12 |
| 2011/0234195 A1* | 9/2011 | Suzuki | H02M 3/07 323/311 |
| 2011/0248834 A1* | 10/2011 | Warner | H04Q 9/00 340/10.34 |
| 2012/0030486 A1* | 2/2012 | Pop | G01D 21/00 713/320 |
| 2012/0075889 A1* | 3/2012 | Sasaki | H02M 1/4225 363/21.09 |

OTHER PUBLICATIONS

Extended European Search Report (EESR) dated Mar. 14, 2013 issued in counterpart European Application No. 12172733.3.

* cited by examiner

OSCILLATOR AND RADIO COMMUNICATION DEVICE

CROSS REFERENCE TO RELATED APPLICATIONS

This application is based upon and claims the benefit of priority from the prior Japanese Patent Application No. 2011-194283, filed on Sep. 6, 2011, the entire contents of which are incorporated herein by reference.

FIELD

The present embodiment relates to an oscillator for detecting a radio signal, and a radio communication device.

BACKGROUND

As a radio receiving circuit system for detecting a radio signal and processing the signal, a method using an oscillator is known. With the system, a high frequency oscillator and a quench circuit for controlling the same are included in a signal detector. The high frequency oscillator receives a sawtooth oscillating control signal from the quench circuit, measures an oscillation start time and the like, and detects the presence of an externally-input signal.

Since the quench circuit always operates and inputs a sawtooth oscillating control signal into the high frequency oscillator in the above system, the oscillator oscillates per sawtooth period. Thus, power consumption is large in the oscillator and the above structure is not suitable as a circuit with low power consumption. Further, since a desired signal frequency does not match with an oscillation frequency of the oscillating circuit, the above structure is easily subjected to deterioration in property or effects by interference wave.

DETAILED DESCRIPTION

According to an embodiment, there is provided with an oscillator including: a clock circuit, a power supply current source and an oscillating circuit.

The clock circuit generates a clock signal.

The power supply current source generates a power supply current according to the clock signal.

The oscillating circuit generates an oscillation signal of a higher frequency than a frequency of the clock signal based on the power supply current and a received signal from an input terminal, the received signal having amplitude of a predetermined level or more.

Hereinafter, an embodiment will be described below with reference to the drawings.

Figure 1:
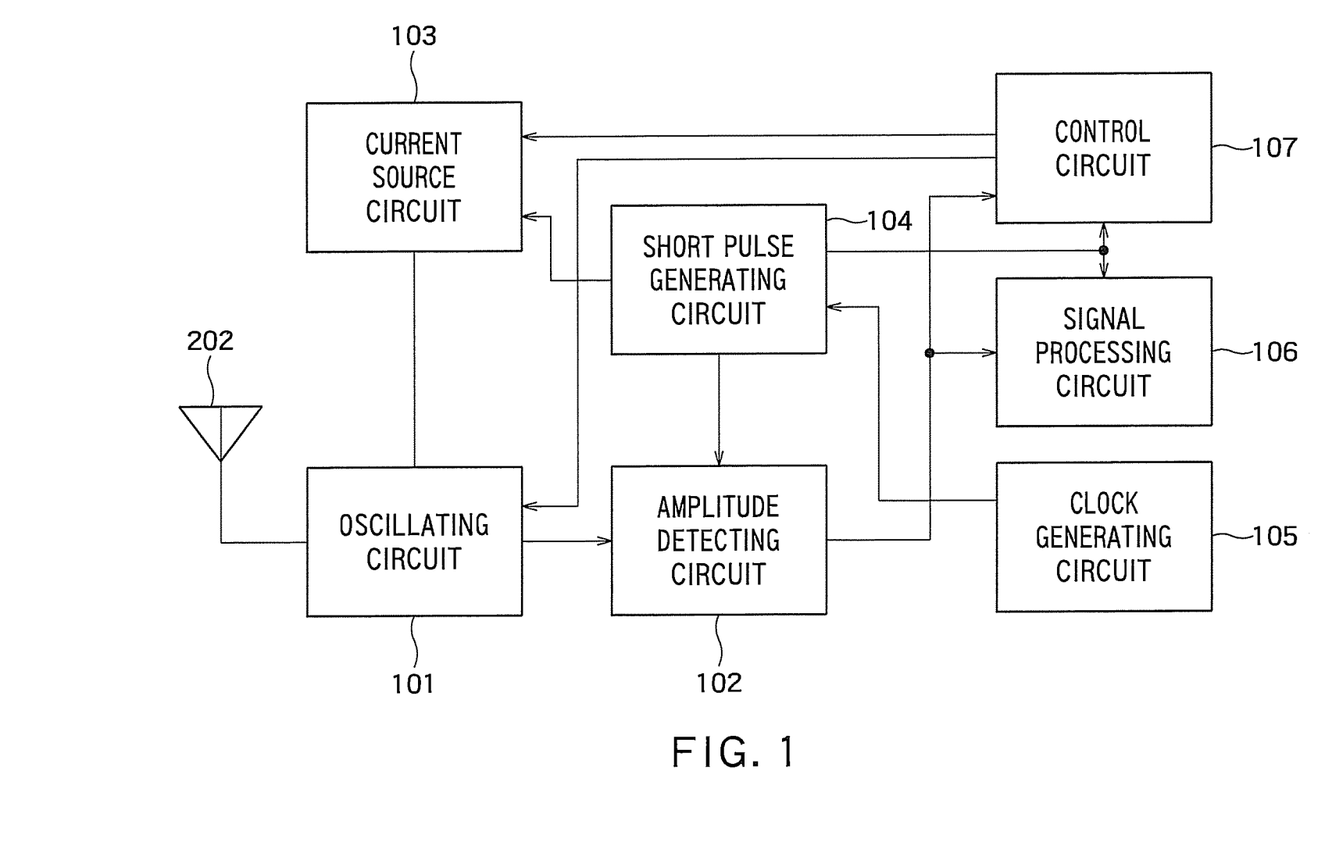
FIG. 1 is a block diagram of an oscillator according to an embodiment.

FIG. 1 is a block structure diagram of an oscillator according to the embodiment.

The oscillator in FIG. 1 comprises an antenna 202, an oscillating circuit 101, a current source circuit 103, an amplitude detecting circuit 102, a short pulse generating circuit 104, a clock circuit 105, a signal processing circuit 106 and a control circuit 107.

The oscillating circuit 101 has a controllable oscillation frequency, and is given a power supply current from the current source circuit 103. The value of the power supply current is controlled such that when an input from the antenna 202 into the oscillating circuit 101 via an input terminal thereof is a no-signal state, the oscillating circuit 101 does not oscillate, and when a signal (received signal) having a desired power or more is input, the oscillating circuit 101 oscillates. The current value is controlled by the control circuit 107. The oscillation frequency of the oscillating circuit 101 is also adjusted under control of the control circuit 107. The oscillation frequency is adjusted so as to be tuned to an external reference input signal.

The clock circuit 105 generates a low frequency clock signal (see FIG. 4(A) described later).

The short pulse generating circuit 104 detects an edge of the low frequency clock signal, and generates a sufficiently shorter pulse than a clock wavelength (see FIG. 4(B) described later).

The short pulse generating circuit 104 inputs the short pulse signal into the current source circuit 103. Only when being input with the pulse signal, the current source circuit 103 generates a power supply current and inputs it into the oscillating circuit 101. Thereby, only when a short pulse is input into the current source circuit 103, the power supply current is input into the oscillating circuit 101. When a radio signal is not input from the antenna 202 during the power supply current input, the oscillating circuit 101 does not oscillate and a consumed current is also less. When a radio signal which is at a desired input signal power or more and has substantially the same oscillation frequency is input from the antenna 202, the oscillating circuit 101 oscillates.

The amplitude detecting circuit 102 detects an amplitude of the oscillation signal based on a reference value, and generates a binary (high/low) signal (demodulation signal).

The signal processing circuit 106 determines a content (pattern) of the demodulation signal. When it is determined that the demodulation signal matches with a desired signal, the signal processing circuit 106 outputs a control signal to an external device. The control signal is a signal for powering on or off the external device, for example.

Figure 2:
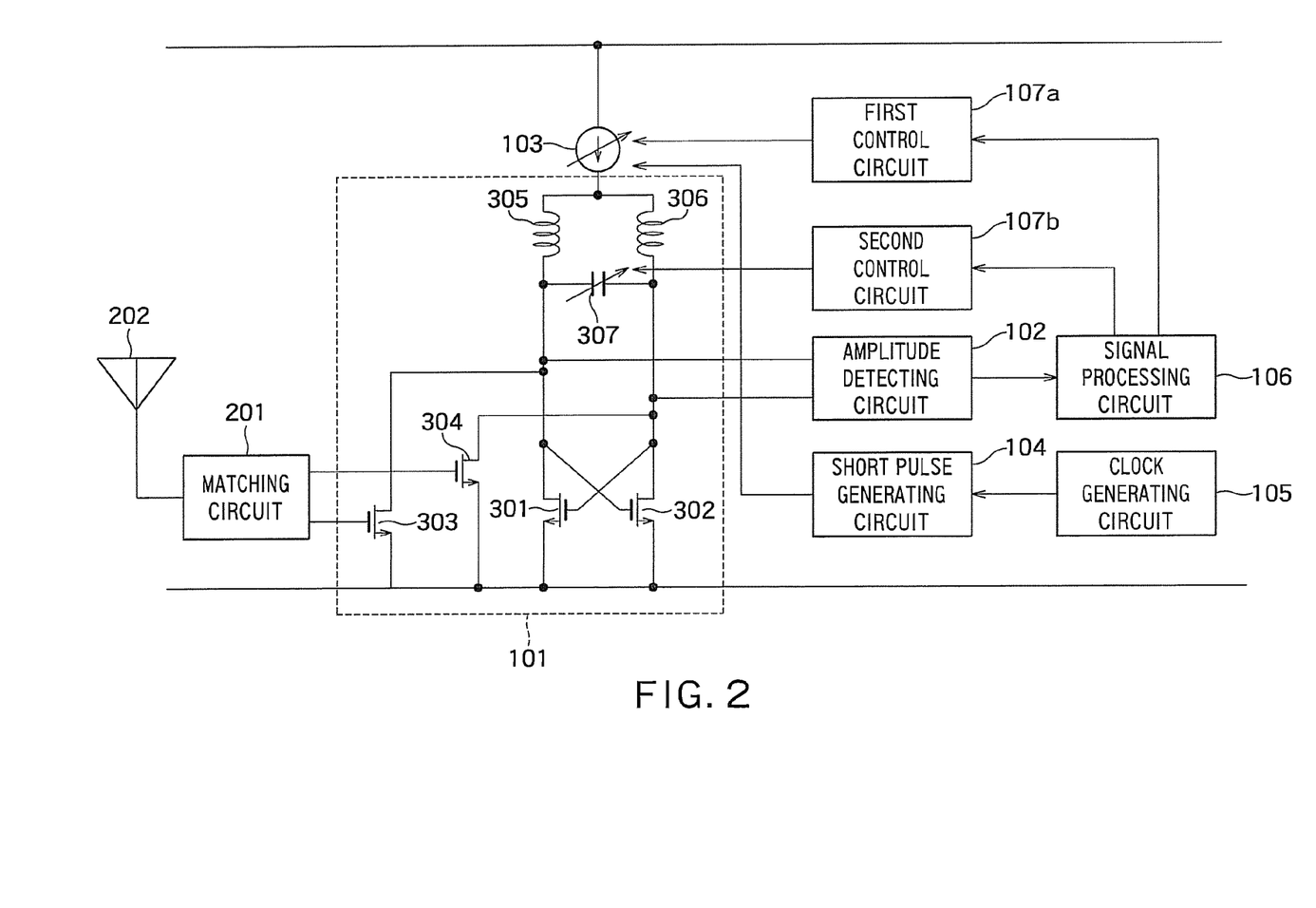
FIG. 2 is a circuit diagram of the oscillator according to the embodiment.

FIG. 2 shows the structure of the oscillator of FIG. 1 in detail. The control circuit 107 in FIG. 1 is divided into a first control circuit 107a and a second control circuit 107b.

The inside of the oscillating circuit 101 is configured of positive feedback transistors 301, 302, input transistors (a signal input buffer circuit) 303, 304, inductors 305, 306, and a capacitor 307.

The positive feedback transistors 301 and 302 have a complementary structure. Since a signal having the same phase of a drain terminal is input into a gate terminal, respectively, a vibration is amplified. The inductors 305, 306 and the capacitor 307 form a resonance circuit, and a resonance frequency signal is input therein so that the vibration keeps. Thus, the oscillator is configured of the circuits. A radio signal from the antenna 202 is subjected to impedance matching and single-phase/differential conversion in a matching circuit 201, and a differential electric signal is input into the oscillating circuit 101. The input transistors 303 and 304 input the differential electric signal inside the oscillating circuit 101.

The oscillation frequency is adjusted by the second control circuit 107b as follows. While an external reference input signal is being input, the capacity value of the capacitor 307 is adjusted by the second control circuit 107b, and the inductors 305, 306 and the resonance frequency are adjusted. The value of the capacitor 307 is fixed where the oscillation amplitude detected by the amplitude detecting circuit 102 is maximum.

The oscillation level is adjusted by the first control circuit 107a as follows. While the input into the oscillating circuit 101 is in a no-signal input state, the power supply current of the current source circuit 103 is increased from zero in a stepwise manner by the first control circuit 107a. As the current increases, the oscillating circuit 101 starts oscillating at a certain current. The oscillation amplitude is detected by the amplitude detecting circuit 102 and is notified to the first control circuit 107a. The first control circuit 107a stores the current value at which oscillation does not occur. For example, the power supply current value m (m is an integer of 1 or more) stages before the power supply current where oscillation occurs is stored. Then, a signal having a predetermined input power is input into the oscillator 101, and the amplitude detecting circuit 102 detects and confirms that the oscillating circuit 101 oscillates at this time. That is, the control circuit 107 detects and stores the power supply current value at which oscillation does not occur in a no-signal input state and oscillation occurs when a signal having a predetermined input power is input. The oscillation level adjustment will be described below in detail.

The adjustment of the oscillation frequency and the adjustment of the oscillation level have been completed as described above.

Figure 3:
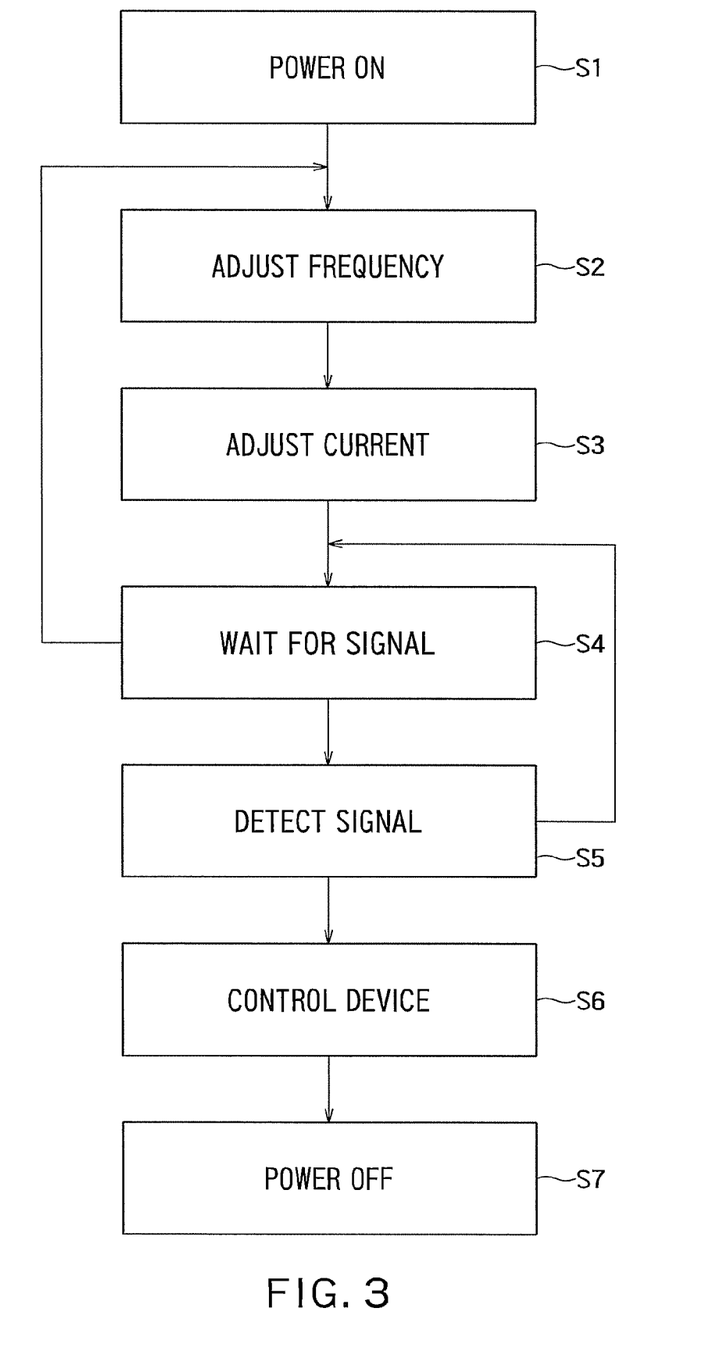
FIG. 3 is a control sequence diagram of the oscillator according to the embodiment.

FIG. 3 shows a control sequence of the oscillator according to the present embodiment.

The oscillator enters the power supply ON state (S1), then the oscillation frequency of the oscillating circuit 101 is adjusted (S2), and then the current value of the current source circuit 103 is adjusted (S3).

In this state, the oscillator enters a signal waiting state, and waits for a radio signal to be input (S4).

Meanwhile, when a predetermined period has elapsed in a timer or an event such as change in temperature has occurred, the processing returns to step S2 to adjust the oscillation frequency or to adjust the current value again. This is because the oscillation frequency or the power supply current value for oscillation is shifted depending on the temperature or the state of voltage system.

When a radio signal is input from the antenna 202 during the signal waiting, a signal detection processing (S5) is performed. That is, an oscillation frequency signal is extracted by the oscillating circuit 101 and a binary signal (demodulation signal) is generated by the amplitude detecting circuit 102 based on the extracted signal. The signal processing circuit 106 determines whether the demodulation signal corresponds to a desired one. When the signal is not desired, the processing returns to the signal waiting in step S4.

When the demodulation signal is desired, the signal processing circuit 106 outputs a control signal for an external device or the like. For example, a control signal for switching the main power supply of the external device from OFF to ON is output. Thereafter, the oscillator is powered off.

FIGS. 4(A) to 4(E) show the operation timing charts of a clock signal, a short pulse signal, a RF (Radio Frequency) signal, an oscillator's oscillation signal and a received signal, respectively.

Figure 4:
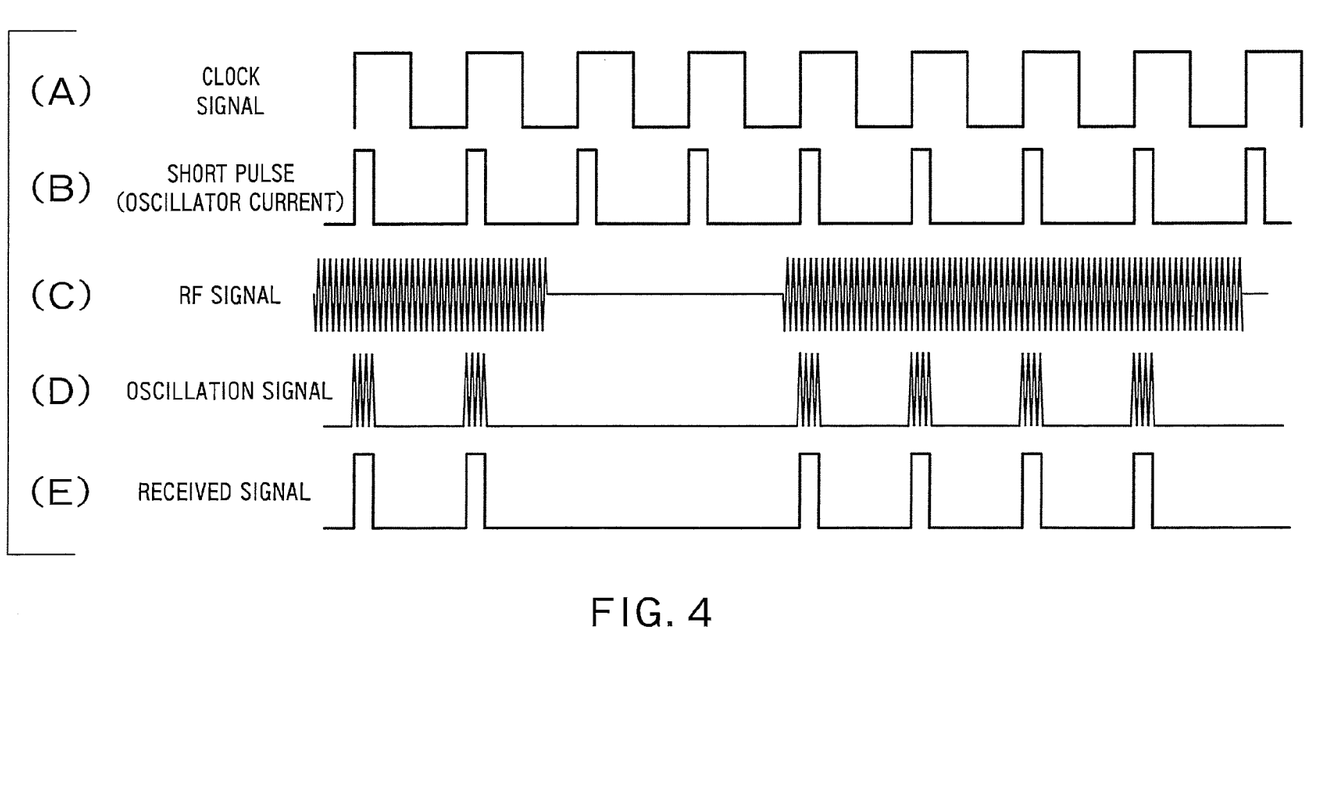
FIG. 4 is an operation timing chart of a clock signal, a short pulse signal, a RF signal, an oscillator's oscillation signal and a received signal.

The period of the clock signal is sufficiently longer than that of the RF signal received at the antenna 202, and is sufficiently shorter than the basic period of the data rate of data on the RF signal (FIG. 4(A)).

The short pulse signal is generated by detecting an edge of the clock signal as a pulse signal, and has a sufficiently shorter pulse width than the clock wavelength (FIG. 4(B)).

For example, the clock period is 100 us and the pulse width of the short pulse is 1 us. The power supply current is supplied to the oscillating circuit 101 according to the pulse width of the short pulse. Thereby, the duty ratio of the current is 1/100 and a consumed power is reduced.

While the short pulse is generated at an edge rising timing in the example of FIG. 4(B), the short pulse may be generated at a timing offset from the rising edge (for example, in the middle between the rising edge and the falling edge).

The RF signal is a low data rate signal on a high frequency carrier wave, and is delivered with on/off keying (FIG. 4(C)). For example, when the RF signal is a microwave in 2.45 GHz band and its data rate is 1 kb/s, the basic period is 1000 us.

When the short pulse is on, that is, the oscillator's power supply current is supplied and the RF signal is on, the oscillating circuit 101 reacts to the RF signal to be in an oscillation state, and outputs an oscillation signal (FIG. 4(D)). When the RF signal is off, the oscillator remains in a steady state with no vibration (FIG. 4(D)).

In this way, the oscillation and the steady state are detected and the presence of the on/off keying signal is determined by the amplitude detecting circuit 102 (FIG. 4(E)).

Figure 5:
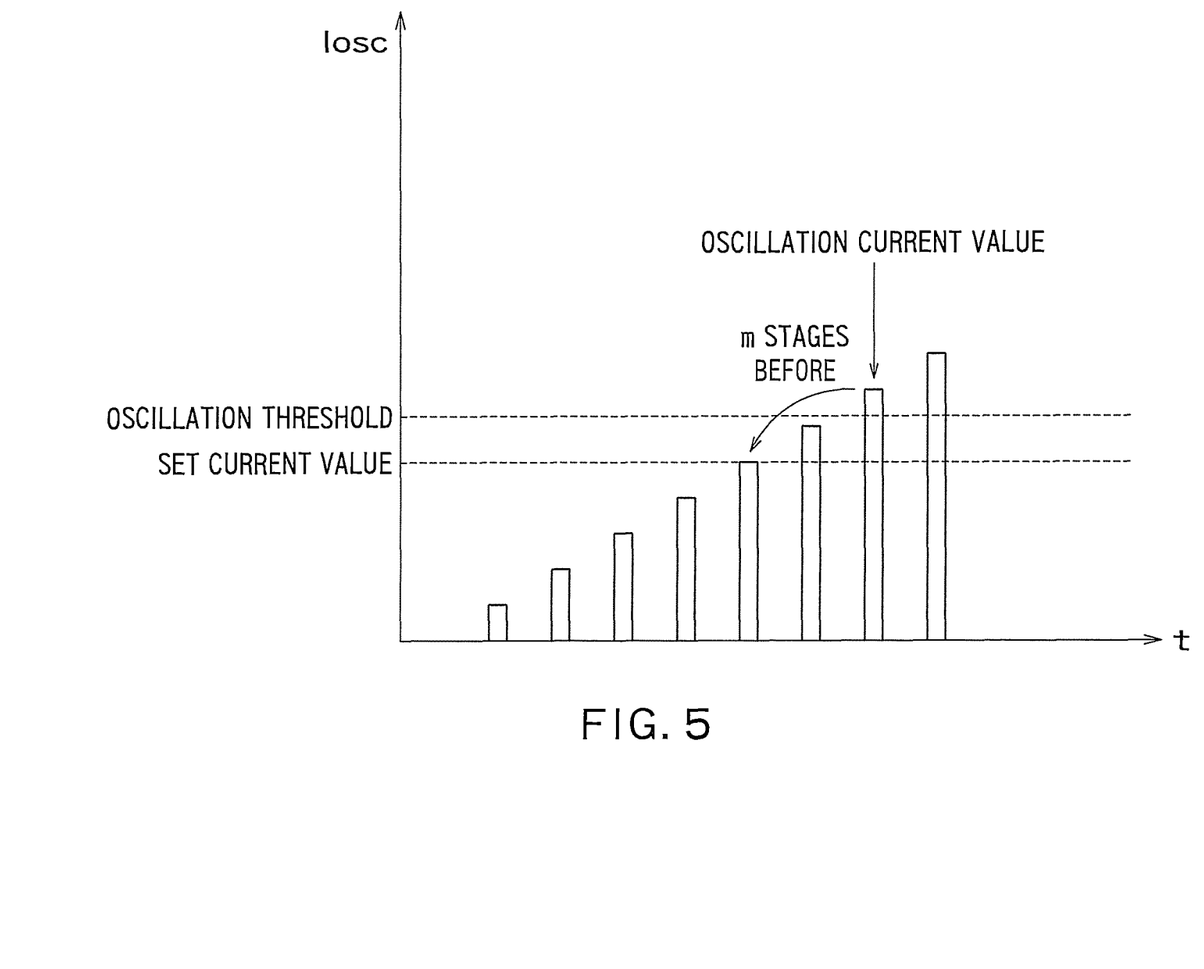
FIG. 5 is an explanatory diagram of current adjustment.

FIG. 5 shows a sequence of current adjustment. The horizontal axis indicates time and the vertical axis indicates the value of the power supply current of the oscillating circuit 101.

The amount of supplied current to the oscillating circuit 10 is increased step by step over time according to the short pulse shown in FIG. 4(B). At this time, a RF input part of the oscillating circuit 101 performs a processing such as grounding to prevent an external noise from being input. A current at which oscillation does not occur is initially supplied and a current is gradually increased, and when a current exceeding an oscillation threshold in the Figure is supplied, the oscillator starts self-oscillating. The state is stored and the current value is returned to a current value m (m is an integer of 1 or more) stages before the step. In the Figure, the current value returns two stages before. Assuming that this state is a current setting value, the steady state with no vibration remains during no signal, and when a weak RF signal is input, oscillation starts.

Figure 6:
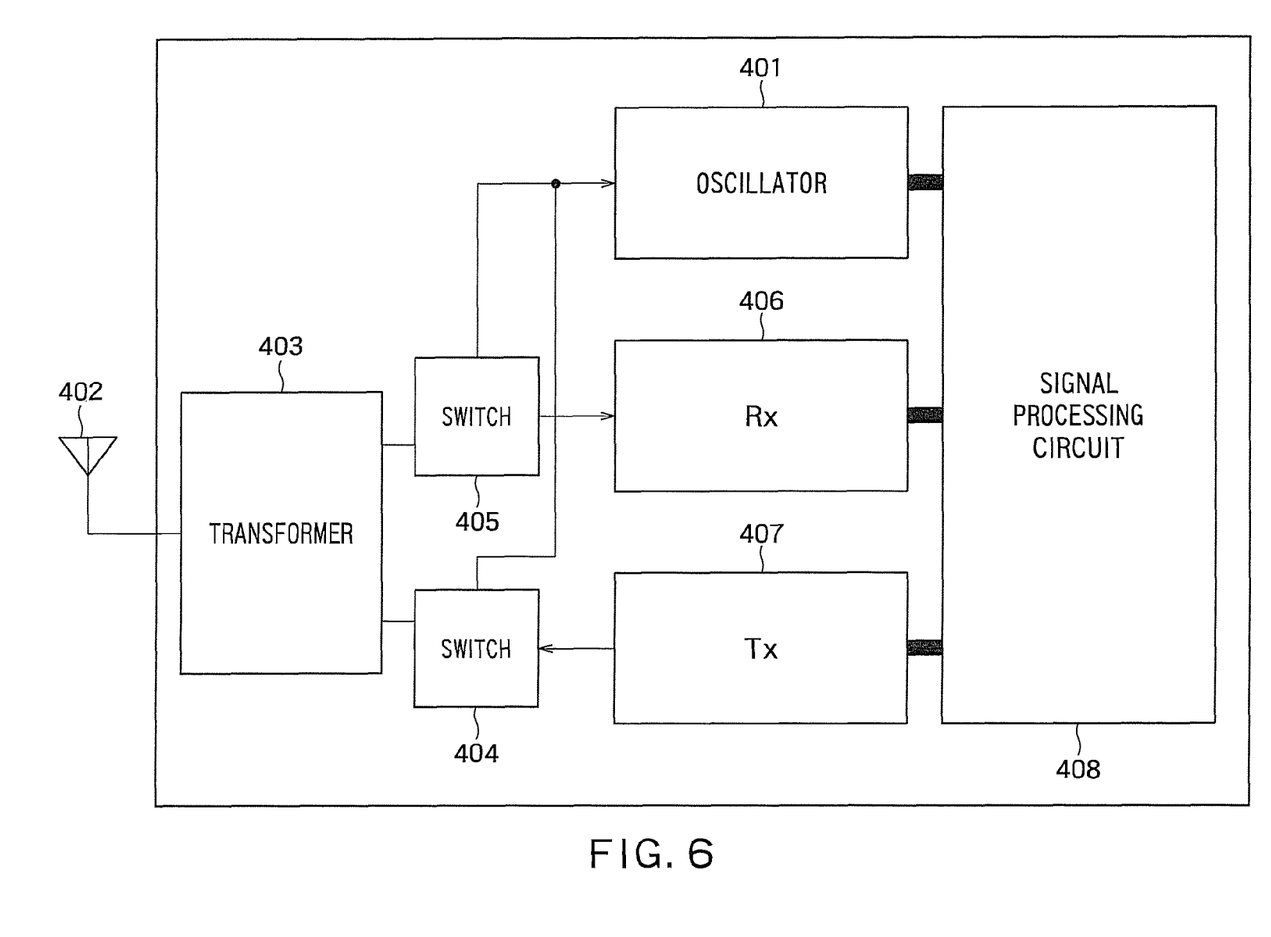
FIG. 6 is a block diagram of a radio device comprising the oscillator according to the embodiment

FIG. 6 is a block diagram of a radio device mounting thereon the oscillator according to the present embodiment.

A Tx part 407 and an Rx part 406 are a transmitter and a receiver of the radio device, respectively.

An oscillator 401 is provided independently from the transmitter and the receiver. It waits for a signal from an antenna 402 via a switch 405. There is a path for inputting a reference frequency signal from the Tx part 407 via a switch 404 into the oscillator 401. The reference frequency signal corresponds to the external reference input signal and is used for adjusting the oscillation frequency. A transformer 403 is provided between the switches 404, 405 and the antenna 402. A signal processing circuit 408 processes transmission/received signals in the Tx part 407 and the Rx part 406.

During signal waiting, the Tx part 407 and the Rx part 406 are powered off and only the oscillator 401 waits for a signal. When the oscillator 401 receives a desired radio signal, the oscillator 401 outputs a control signal for turning on the power supplies of the Tx part 407 and the Rx part 406 so that the Tx part 407 and the Rx part 406 are powered on. The switch 405 is switched from the oscillator 401 to the Rx part 406 and the switch 404 is switched from the oscillator 401 to the transformer 403.

The oscillator according to the present embodiment is used in this way so that lowered power consumption is achieved while a signal is always being waited during signal waiting.

As described above, with the present embodiment, a signal waiting circuit with high sensitivity and super-low power consumption can be provided.

Figure 7:
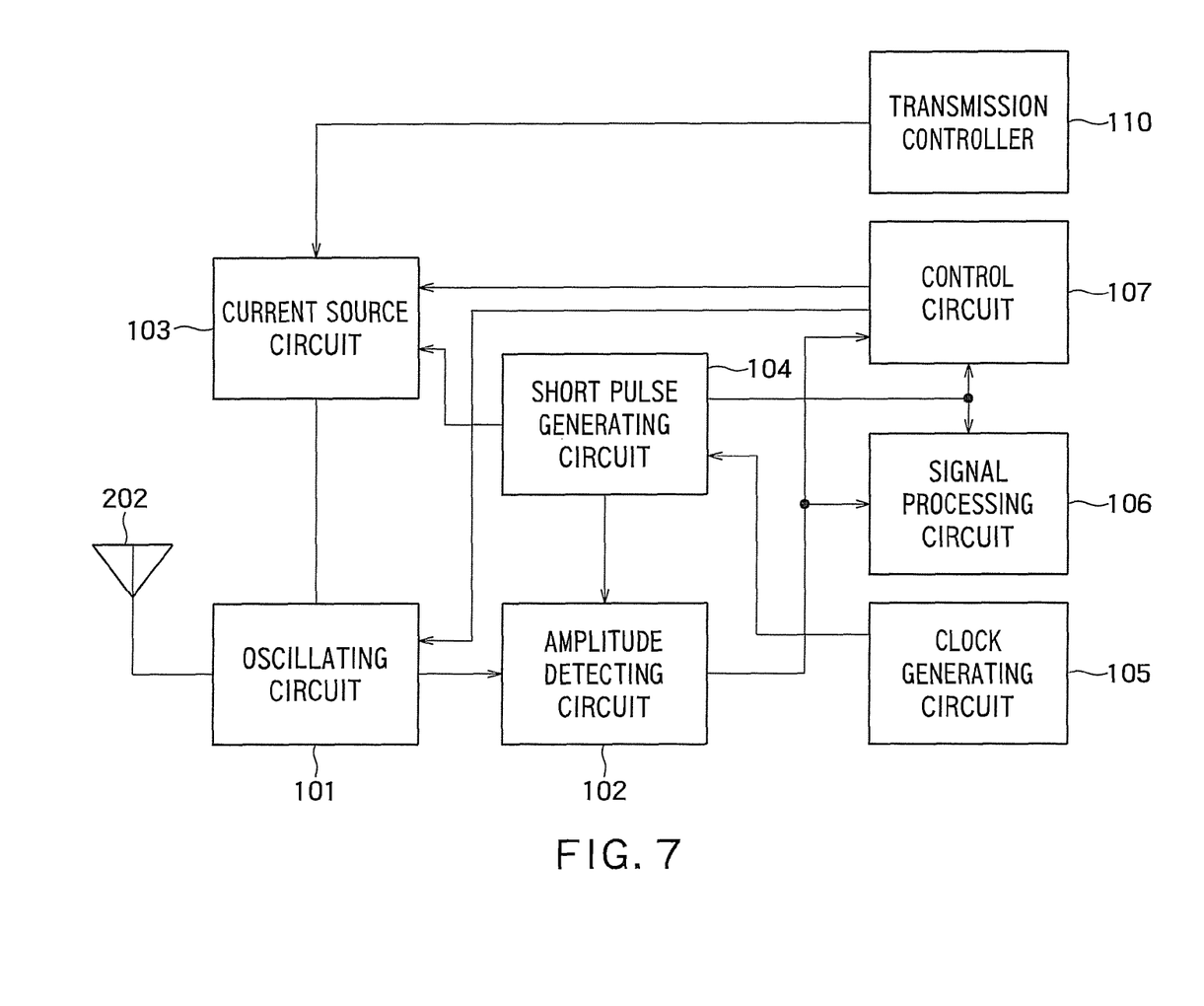
FIG. 7 is a block diagram of the radio device for generating a transmission signal by use of an oscillating circuit.

FIG. 7 is a block diagram when the oscillating circuit is used for transmission. A transmission controller 110 is added to the constituents of FIG. 1. The constituents having the same names as those in FIG. 1 are denoted with the same reference numerals, and a repeated explanation thereof will be omitted except for extended processings.

The transmission controller 110 controls a power supply current to an oscillating circuit 101 when transmitting a transmission signal. Assuming a modulation system of the transmission signal as on/off keying, the transmission controller 110 controls the power supply circuit 103 such that a current at a current level where self-oscillation is possible can keep being supplied to the oscillating circuit 101 during an ON signal transmitting time. During an OFF signal, the power supply circuit 103 is controlled such that a current supply to the oscillating circuit 101 is stopped. The oscillator is oscillated according to the transmission signal in this way, thereby transmitting the signal.

As described above, according to the present embodiment, a transmitting circuit with high sensitivity and super-low power consumption can be provided.

Figure 8:
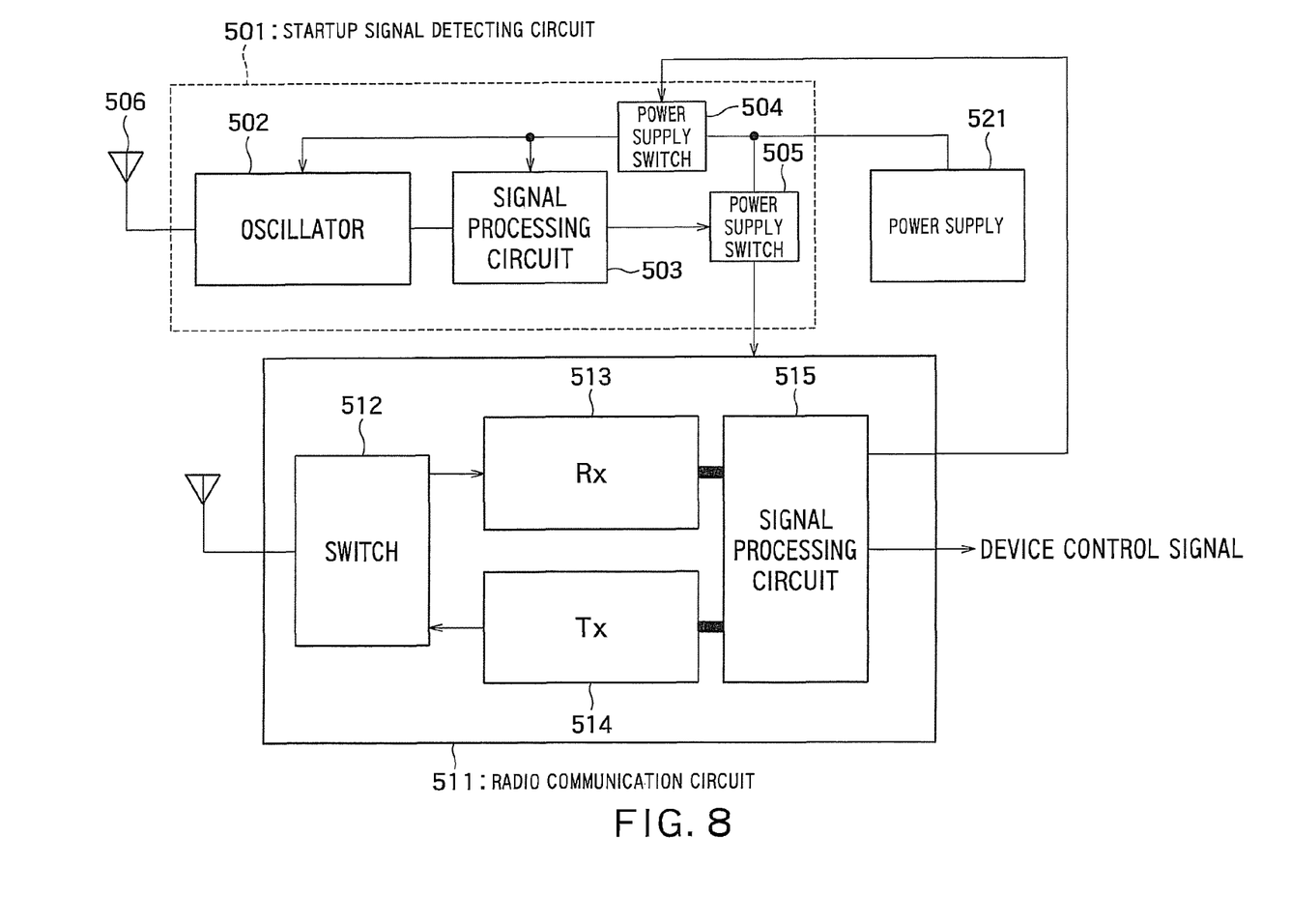
FIG. 8 is a block diagram of a radio communication circuit control system using the oscillator according to the embodiment.

FIG. 8 is a block diagram of a radio communication circuit control system (radio communication device) using the oscillator according to the present embodiment.

A startup signal detecting circuit 501 comprises an oscillator 502, a signal processing circuit 503, and power supply switches 504, 505.

A radio communication circuit 511 comprises a Tx part 514, an Rx part 513, a switch 512 and a signal processing circuit 515.

A power supply 521 is directed for supplying a power to the startup signal detecting circuit 501 and the radio communication circuit 511.

During signal waiting, the power supply switch 505 is powered off to stop supplying a power to the radio communication circuit 511, and the power supply switch 504 is powered on to supply a power to the startup signal detecting circuit 501.

When a radio signal is received by the oscillator 502 via an antenna 506, the signal processing circuit 503 determines whether the radio signal is a desired signal, and when it is a desired signal, the power supply switch 505 is switched to ON. Thereafter, when radio communication is normally made in the radio communication circuit 511, a control signal for powering off the power supply switch 504 of the startup signal detecting circuit 501 is output from the signal processing circuit 515 and the signal processing circuit and the oscillator of the startup signal detecting circuit 501 is powered off until the radio communication circuit 511 terminates the communication.

Since the radio communication circuit 511 can be completely powered off during the signal waiting in the system using the oscillator according to the present embodiment, lowered power consumption can be achieved while always waiting for a signal.

In the above embodiment, when a power is supplied to the radio communication circuit 511 and radio communication is normally made, power supply to the oscillator and the signal processing circuit in the startup signal detecting circuit 501 is stopped, but the power supply to the oscillator and the signal processing circuit may not be stopped and may be continued.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An oscillator comprising:
a clock circuit to generate a clock signal;
a power supply current source to generate a power supply current according to a timing of the clock signal;
an input terminal to receive a signal via an antenna;
an oscillating circuit to generate an oscillation signal of a higher frequency than a frequency of the clock signal based on the power supply current and the received signal from the input terminal, when the received signal has an amplitude of a predetermined level or more; and
a first control circuit to control the power supply current source,
wherein the first control circuit increases, in a state in which the input terminal is grounded, the power supply current in a stepwise manner to detect a current value at which the oscillating circuit first oscillates, and
wherein the first control circuit controls the power supply current source so as to generate the power supply current of a value less than the detected current value.

2. The oscillator according to claim 1, wherein the first control circuit controls the power supply current to a current value which is m stages before the current value at which the oscillating circuit first oscillates, where m is an integer of 1 or more.

3. The oscillator according to claim 1, further comprising:
a short pulse generating circuit to detect an edge of the clock signal, and to generate a short pulse signal having a shorter pulse width than a wavelength of the clock signal,
wherein the power supply current source generates the power supply current according to a timing of the short pulse signal.

4. The oscillator according to claim 1, further comprising:
a second control circuit to control an oscillation frequency of the oscillating circuit based on a reference frequency signal.

5. The oscillator according to claim 1, wherein the oscillating circuit includes a positive feedback amplifying circuit, an inductor, a capacitor, and a signal input buffer circuit.

6. The oscillator according to claim 1, further comprising:
an amplitude detecting circuit to detect an amplitude of the oscillation signal and to generate a demodulation signal according to the amplitude; and
a signal processing circuit configured to process the demodulation signal.

7. The oscillator according to claim 6, wherein when detecting that the demodulation signal matches with a predetermined signal, the signal processing circuit outputs a control signal to an external device.

8. The oscillator according to claim 7, further comprising:
a second control circuit to control an oscillation frequency of the oscillating circuit based on a reference frequency signal,
wherein the oscillation frequency and the power supply current are adjusted by the second control circuit and the first control circuit when the second control circuit is powered on, and
wherein the oscillator is powered off after the control signal is output by the signal processing circuit.

9. The oscillator according to claim 1, further comprising:
a transmission controller to control oscillation and non-oscillation of the oscillating circuit by controlling the power supply current, and thereby generate a transmission signal depending on the oscillation signal.

10. The oscillator according to claim 1, wherein the first control circuit grounds the input terminal to detect the current value at which the oscillator first oscillates and releases the grounding of the input terminal after the current value is detected.

11. A radio communication device comprising:
a startup signal detecting circuit including an oscillator;
a radio communication circuit configured to make radio communication; and
a power supply to supply a power to the startup signal detecting circuit and the radio communication circuit,
wherein the oscillator comprises:
a clock circuit to generate a clock signal;
a power supply current source to generate a power supply current according to a timing of the clock signal;
an input terminal to receive a signal via an antenna;
an oscillating circuit to generate an oscillation signal of a higher frequency than a frequency of the clock signal based on the power supply current and the received signal from the input terminal, when the received signal has an amplitude of a predetermined level or more; and
a first control circuit to control the power supply current source,
wherein the first control circuit increases, in a state in which the input terminal is grounded, the power supply current in a stepwise manner to detect a current value at which the oscillating circuit first oscillates,
wherein the first control circuit controls the power supply current source so as to generate the power supply current of a value less than the detected current value, and
wherein the power supply supplies a power to the startup signal detecting circuit when the oscillator is waiting to receive a signal, and, in a case in which the oscillation signal is output from the oscillator, the power supply supplies the power to the radio communication circuit.

12. The oscillator according to claim 11, wherein the first control circuit grounds the input terminal to detect the current value at which the oscillator first oscillates and releases the grounding of the input terminal after the current value is detected.

13. The radio communication device according to claim 11, wherein the first control circuit controls the power supply current to a current value which is m stages before the current value at which the oscillating circuit first oscillates, where m is an integer of 1 or more.

14. The radio communication device according to claim 11, further comprising:
a short pulse generating circuit to detect an edge of the clock signal, and to generate a short pulse signal having a shorter pulse width than a wavelength of the clock signal,
wherein the power supply current source generates the power supply current according to a timing of the short pulse signal.

15. The radio communication device according to claim 11, further comprising:
a second control circuit to control an oscillation frequency of the oscillating circuit based on a reference frequency signal.

16. The radio communication device according to claim 11, wherein the oscillating circuit includes a positive feedback amplifying circuit, an inductor, a capacitor, and a signal input buffer circuit.

17. The radio communication device according to claim 11, further comprising:
an amplitude detecting circuit to detect an amplitude of the oscillation signal and to generate a demodulation signal according to the amplitude; and
a signal processing circuit configured to process the demodulation signal.

18. The radio communication device according to claim 17, wherein when detecting that the demodulation signal matches with a predetermined signal, the signal processing circuit outputs a control signal to an external device.

19. The radio communication device according to claim 18, further comprising:
a second control circuit to control an oscillation frequency of the oscillating circuit based on a reference frequency signal,
wherein the oscillation frequency and the power supply current are adjusted by the second control circuit and the first control circuit when the second control circuit is powered on, and
wherein the oscillator is powered off after the control signal is output by the signal processing circuit.

20. The radio communication device according to claim 11, further comprising:
a transmission controller to control oscillation and non-oscillation of the oscillating circuit by controlling the power supply current, and thereby generate a transmission signal depending on the oscillation signal.

* * * * *